(12) United States Patent
Hatanaka et al.

(10) Patent No.: US 7,699,971 B2
(45) Date of Patent: Apr. 20, 2010

(54) MICROSTRUCTURE AND METHOD OF MANUFACTURING THE SAME

(75) Inventors: Yusuke Hatanaka, Shizuoka (JP); Yoshinori Hotta, Aichi (JP)

(73) Assignee: FUJIFILM Corporation, Tokyo (JP)

( * ) Notice: Subject to any disclaimer, the term of this patent is extended or adjusted under 35 U.S.C. 154(b) by 59 days.

(21) Appl. No.: 11/963,149

(22) Filed: Dec. 21, 2007

(65) Prior Publication Data

US 2008/0152941 A1 Jun. 26, 2008

(30) Foreign Application Priority Data

Dec. 25, 2006 (JP) .............................. 2006-347104

(51) Int. Cl.
*C25D 11/06* (2006.01)
*B32B 3/26* (2006.01)

(52) U.S. Cl. ...................... 205/324; 205/221; 205/172; 205/175; 428/304.4

(58) Field of Classification Search ....................... None
See application file for complete search history.

(56) References Cited

U.S. PATENT DOCUMENTS

| 2002/0145826 | A1 | 10/2002 | Zangari et al. | |
| 2005/0211566 | A1 | 9/2005 | Tomita et al. | |
| 2007/0235342 | A1* | 10/2007 | Matsuo et al. | 205/175 |
| 2008/0081173 | A1* | 4/2008 | Hatanaka et al. | 428/304.4 |

FOREIGN PATENT DOCUMENTS

| EP | 1 643 546 A2 | 4/2006 |
| EP | 1 826 298 A1 | 8/2007 |
| GB | 2 158 098 A | 11/1985 |
| JP | 2005-307341 A | 11/2005 |

OTHER PUBLICATIONS

Wang et al., "Fabrication and characterization of anodic aluminum oxide template," Microelectronic Engineering, vol. 66, No. 1-4, Apr. 2003, pp. 166-170, XP004421513.
Masuda, et al., Self-Ordering of Cell Configuration of Anodic Porous Alumina with Large-Size Pores in Phosphoric Acid Solution, Jpn. J. Appl. Phys., (Nov. 1, 1998), p. L 1340-L 1342, vol. 37, Pt. 2, No. 11A, Publication Board, Japanese Journal of Applied Physics.

* cited by examiner

*Primary Examiner*—Ling Xu
(74) *Attorney, Agent, or Firm*—Sughrue Mion, PLLC (57) ABSTRACT

Disclosed is a method of manufacturing a microstructure, wherein an aluminum substrate is subjected to, in order, (1) a step of subjecting a surface of the aluminum substrate to a first anodizing treatment to form an anodized film having micropores on the surface of the aluminum substrate; (2) a step of partially dissolving the anodized film using an acid or alkali; (3) a step of performing a second anodizing treatment to grow the micropores in their depth direction; and (4) a step of removing a part of the anodized film above inflection points in cross section of the micropores, whereby the microstructure having the micropores formed at a surface of the anodized film is obtained and a microstructure manufactured by the method. The method is capable of obtaining in a short period of time a microstructure having an ordered array of pits without using highly toxic chromic (VI) acid.

5 Claims, 2 Drawing Sheets

MICROSTRUCTURE AND METHOD OF MANUFACTURING THE SAME

The entire contents of all documents cited in this specification are incorporated herein by reference.

BACKGROUND OF THE INVENTION

The present invention relates to a microstructure and its manufacturing method.

In the technical field of metal and semiconductor thin films, wires and dots, it is known that the movement of free electrons becomes confined at sizes smaller than some characteristic length, as a result of which singular electrical, optical and chemical phenomena become observable. Such phenomena are called "quantum mechanical size effects" or simply "quantum size effects." Functional materials which employ such singular phenomena are under active research and development. Specifically, materials having structures smaller than several hundred nanometers in size, typically called microstructures or nanostructures, are the subject of current efforts in material development.

Methods for manufacturing such microstructures include processes in which a nanostructure is directly manufactured by semiconductor fabrication technology, including micropatterning technology such as photolithography, electron beam lithography, or x-ray lithography.

Of particular note is the considerable amount of research being conducted today on processes for manufacturing nanostructures having an ordered microstructure.

One method of forming an ordered structure in a self-regulating manner is illustrated by an anodized alumina film (anodized film) obtained by subjecting aluminum to anodizing treatment in an electrolytic solution as shown in FIG. 2 of H. Masuda et al. (Jpn. J. Appl. Phys., Vol. 37 (1998), pp. L1340-1342, Part 2, No. 11A, 1 Nov. 1998). It is known that a plurality of micropores having diameters of about several nanometers to about several hundreds of nanometers are formed in a regular arrangement within the anodized film. It is also known that when a completely ordered arrangement is obtained by the self-pore-ordering treatment of this anodized film, hexagonal columnar cells will be theoretically formed, each cell having a base in the shape of a regular hexagon centered on a micropore, and that the lines connecting neighboring micropores will form equilateral triangles.

Known examples of applications for such anodized films having micropores include optical functional nanodevices, magnetic devices, luminescent supports and catalyst supports. For example, JP 2005-307341 A describes that an anodized film is applied to a Raman spectrometer by sealing pores with a metal and generating localized plasmon resonance.

A method is known in which pits serving as starting points for micropore formation in anodizing treatment are formed prior to anodizing treatment for forming such micropores. Formation of such pits facilitates controlling the micropore arrangement and variations in pore diameter within desired ranges.

A self-ordering method that makes use of the self-ordering nature in the anodized film is known as a general method for forming pits. This is a method which enhances the orderliness by using the regularly arranging nature of micropores in the anodized film and eliminating factors that may disturb an orderly arrangement.

As described in JP 2005-307341 A, the self-ordering method generally involves performing anodizing treatment, then immersion in a mixed aqueous solution of phosphoric acid and chromic (VI) acid, and thereafter performing anodizing treatment again.

SUMMARY OF THE INVENTION

However, the film removal step using a mixed aqueous solution of phosphoric acid and chromic (VI) acid as in JP 2005-307341 A has usually required an extended period of time (e.g., from several hours to well over ten hours) although the time required varies with the thickness of the anodized film. In addition, a highly safe method which does not use highly toxic chromic (VI) acid is desirable.

It is therefore an object of the invention to provide a microstructure-manufacturing method that is capable of obtaining in a short period of time a microstructure having an ordered array of pits without using highly toxic chromic (VI) acid. Another object of the invention is to provide the microstructure obtained by the manufacturing method described above.

The inventors of the invention have made intensive studies to achieve the above objects and found that a structure having an ordered array of pits can be obtained in a short period of time by repeating the procedure of removing a specific portion of the anodized film formed by the self-ordering method, instead of the film removal step using a mixed aqueous solution of phosphoric acid and chromic (VI) acid. The invention has been completed on the basis of such finding.

Accordingly, the invention provides the following (i) to (v).

(i) A method of manufacturing a microstructure, wherein an aluminum substrate is subjected to, in order, (1) a step of subjecting a surface of the aluminum substrate to a first anodizing treatment to form an anodized film having micropores on the surface of the aluminum substrate;

(2) a step of partially dissolving the anodized film using an acid or alkali;

(3) a step of performing a second anodizing treatment to grow the micropores in their depth direction; and (4) a step of removing a part of the anodized film above inflection points in cross section of the micropores, whereby the microstructure having the micropores formed at a surface of the anodized film is obtained.

(ii) The manufacturing method according to (i) above, wherein the steps (3) and (4) are repeatedly performed twice or more in this order.

(iii) The manufacturing method according to (i) or (ii) above, wherein, in the step (4), the anodized film is dissolved and removed using an acid or alkali.

(iv) A microstructure obtained by the manufacturing method according to any one of (i) to (iii) above.

(v) The microstructure according to (iv) above, wherein a degree of ordering of micropores as defined by formula (I):

$$\text{Degree of Ordering}(\%) = B/A \times 100 \tag{1}$$

(wherein A represents a total number of micropores in a measurement region; and B represents a number of specific micropores in the measurement region for which, when a circle is drawn so as to be centered on a center of gravity of a specific micropore and so as to be of a smallest radius that is internally tangent to an edge of another micropore, the circle includes centers of gravity of six micropores other than the specific micropore) is at least 50%.

The microstructure-manufacturing method of the invention enables microstructures having an ordered array of pits to be obtained in a short period of time.

DETAILED DESCRIPTION OF THE PREFERRED EMBODIMENTS

The microstructure-manufacturing method of the invention is described more fully below.

The invention provides a method of manufacturing a microstructure, wherein an aluminum substrate is subjected to, in order, (1) a step of subjecting a surface of the aluminum substrate to a first anodizing treatment to form an anodized film having micropores on the surface of the aluminum substrate;

(2) a step of partially dissolving the anodized film using an acid or alkali;

(3) a step of performing a second anodizing treatment to grow the micropores in their depth direction; and (4) a step of removing a part of the anodized film above inflection points in cross section of the micropores, whereby the microstructure having the micropores formed at a surface of the anodized film is obtained.

The microstructure-manufacturing method of the invention is described below by referring to the accompanying drawings. FIGS. 1A to 1D are end views schematically showing an aluminum substrate and an anodized film formed on the aluminum substrate for use in illustrating the inventive method of manufacturing microstructures.

Step (1)

In Step (1), at least one surface of the aluminum substrate is anodized to form a micropore-having anodized film on the surface of the aluminum substrate.

Figure 1A:
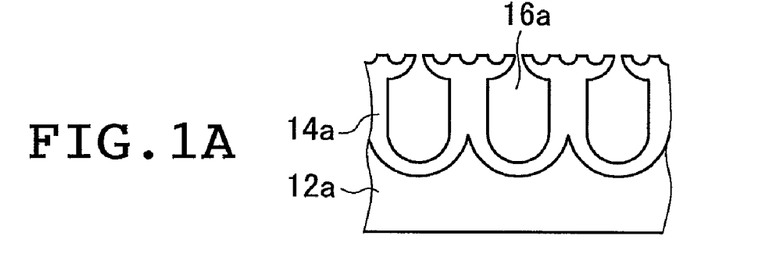
FIGS. 1A to 1D are end views schematically showing an aluminum substrate and an anodized film formed on the aluminum substrate for use in illustrating the inventive method of manufacturing microstructures.

FIG. 1A shows that an anodized film 14a having micropores 16a was formed on the surface of an aluminum substrate 12a in Step (1).

<Aluminum Substrate>

The aluminum substrate is not subject to any particular limitation. Illustrative examples include pure aluminum plate; alloy plates composed primarily of aluminum and containing trace amounts of other elements; substrates made of low-purity aluminum (e.g., recycled material) on which high-purity aluminum has been vapor-deposited; substrates such as silicon wafers, quartz or glass whose surface has been covered with high-purity aluminum by a process such as vapor deposition or sputtering; and resin substrates on which aluminum has been laminated.

Of the aluminum substrate, the surface on which an anodized film is provided by anodizing treatment has an aluminum purity of preferably at least 99.5 wt %, more preferably at least 99.9 wt % and even more preferably at least 99.99 wt %. At an aluminum purity within the above range, the pore arrangement will be sufficiently well-ordered.

There is no particular limitation on the shape of the aluminum substrate. The aluminum substrate may be, for example, in the form of a web or discrete sheets.

<Transport of Web with Rolls>

When the aluminum substrate is in the form of a web, Steps (1) to (4) are preferably performed as the aluminum web is transported.

From the viewpoint of stably transporting a large amount of aluminum web, transport rolls used for transporting the aluminum web each preferably has a radius of curvature of at least 50 mm, more preferably at least 70 mm and even more preferably at least 100 mm. At a radius of curvature within such range, the aluminum web is not strongly pressed against the transport rolls and is hence unlikely to tear.

In view of transport of a large amount of web, the aluminum web preferably has a width of at least 50 mm, more preferably at least 100 mm and even more preferably at least 150 mm. At a width within such range, the tension is unlikely to cause the aluminum web to tear.

In view of transport of a large amount of web, the transport rate is preferably in a range of 1 mm/min to 150 m/min, more preferably 10 mm/min to 100 m/min and even more preferably 50 mm/min to 50 m/min. Within such range, the transport rate is not so high that the aluminum web is not likely to tear, and is also not so low as to lower the productivity.

The aluminum web may be transported in a continuous or discontinuous manner.

It is preferable for the surface of the aluminum substrate to be subjected beforehand to degreasing treatment and mirror-like finishing treatment.

If the microstructure obtained by the invention is to be used in applications that make use of its optical transparency, it is preferable that an aluminum substrate be subjected to heat treatment beforehand. Heat treatment will enlarge the region where the array of pores is highly ordered.

<Heat Treatment>

Heat treatment is preferably carried out at a temperature of from 200 to 350° C. for a period of about 30 seconds to about 2 minutes. The orderliness of the array of micropores formed in the subsequently described anodizing treatment is enhanced in this way.

Following heat treatment, it is preferable to rapidly cool the aluminum substrate. The method of cooling is exemplified by a method involving direct immersion of the aluminum substrate in water or the like.

<Degreasing Treatment>

Degreasing treatment is carried out with a suitable substance such as an acid, alkali or organic solvent so as to dissolve and remove organic substances, including dust, grease and resins, adhering to the aluminum surface, and thereby prevent defects due to organic substances from arising in each of the subsequent treatments.

Known degreasers may be used in degreasing treatment. For example, degreasing treatment may be carried out using any of various commercially available degreasers by the prescribed method.

Preferred methods include the following: a method in which an organic solvent such as an alcohol (e.g., methanol), a ketone, benzine or a volatile oil is brought into contact with the aluminum surface at ambient temperature (organic solvent method); a method in which a liquid containing a surfactant such as soap or a neutral detergent is brought into contact with the aluminum surface at a temperature of from ambient temperature to 80° C., after which the surface is rinsed with water (surfactant method); a method in which an aqueous sulfuric acid solution having a concentration of 10 to 200 g/L is brought into contact with the aluminum surface at a temperature of from ambient temperature to 70° C. for a period of 30 to 80 seconds, following which the surface is rinsed with water; a method in which an aqueous solution of sodium hydroxide having a concentration of 5 to 20 g/L is brought into contact with the aluminum surface at ambient temperature for about 30 seconds while electrolysis is carried out by passing a direct current through the aluminum surface as the cathode at a current density of 1 to 10 A/dm$^2$, following which the surface is brought into contact with an aqueous solution of nitric acid having a concentration of 100 to 500 g/L and thereby neutralized; a method in which any of various known anodizing electrolytic solutions is brought into contact with the aluminum surface at ambient temperature while electrolysis is carried out by passing a direct current at a current density of 1 to 10 A/dm$^2$ or an alternating current through the aluminum surface as the cathode; a method in which an aqueous alkali solution having a concentration of 10 to 200 g/L is brought into contact with the aluminum surface at 40 to 50° C. for 15 to 60 seconds, following which the surface is brought into contact with an aqueous nitric acid solution having a concentration of 100 to 500 g/L and thereby neutralized; a method in which an emulsion prepared by mixing a surfactant, water or the like into an oil such as gas oil or kerosene is brought into contact with the aluminum surface at a temperature of from ambient temperature to 50° C., following which the surface is rinsed with water (emulsion degreasing method); and a method in which a mixed solution of, for example, sodium carbonate, a phosphate and a surfactant is brought into contact with the aluminum surface at a temperature of from ambient temperature to 50° C. for 30 to 180 seconds, following which the surface is rinsed with water (phosphate method).

The method used for degreasing treatment is preferably one which may remove grease from the aluminum surface but causes substantially no aluminum dissolution. Hence, the organic solvent method, surfactant method, emulsion degreasing method and phosphate method are preferred.

<Mirror-Like Finishing Treatment>

Mirror-like finishing treatment is carried out to eliminate surface asperities of the aluminum substrate and improve the uniformity and reproducibility of grain-forming treatment by a process such as electrodeposition. Examples of surface asperities of the aluminum substrate include rolling streaks formed during rolling when the aluminum substrate has been produced by a process including rolling.

In the practice of the invention, mirror-like finishing treatment is not subject to any particular limitation, and may be carried out using any suitable method known in the art. Examples of suitable methods include mechanical polishing, chemical polishing, and electrolytic polishing.

Illustrative examples of suitable mechanical polishing methods include polishing with various commercial abrasive cloths, and methods that combine the use of various commercial abrasives (e.g., diamond, alumina) with buffing. More specifically, a method which is carried out with an abrasive while changing over time the abrasive used from one having coarser particles to one having finer particles is appropriately illustrated. In such a case, the final abrasive used is preferably one having a grit size of 1500. In this way, a glossiness of at least 50% (in the case of rolled aluminum, at least 50% in both the rolling direction and the transverse direction) can be achieved.

Examples of chemical polishing methods include various methods mentioned in the 6$^{th}$ edition of Aluminum Handbook (Japan Aluminum Association, 2001), pp. 164-165.

Preferred examples include phosphoric acid/nitric acid method, Alupol I method, Alupol V method, Alcoa R5 method, $H_3PO_4$—$CH_3COOH$—Cu method and $H_3PO_4$—$HNO_3$—$CH_3COOH$ method. Of these, the phosphoric acid/nitric acid method, the $H_3PO_4$—$CH_3COOH$—Cu method and the $H_3PO_4$—$HNO_3$—$CH_3COOH$ method are especially preferred.

With chemical polishing, a glossiness of at least 70% (in the case of rolled aluminum, at least 70% in both the rolling direction and the transverse direction) can be achieved.

Examples of electrolytic polishing methods include various methods mentioned in the 6$^{th}$ edition of Aluminum Handbook (Japan Aluminum Association, 2001), pp. 164-165.

A preferred example is the method described in U.S. Pat. No. 2,708,655.

The method described in Jitsumu Hyomen Gijutsu (Practice of Surface Technology), Vol. 33, No. 3, pp. 32-38 (1986) is also preferred.

With electrolytic polishing, a glossiness of at least 70% (in the case of rolled aluminum, at least 70% in both the rolling direction and the transverse direction) can be achieved.

These methods may be suitably combined and used. In a preferred example, a method that uses an abrasive is carried out by changing over time the abrasive used from one having coarser particles to one having finer particles, following which electrolytic polishing is carried out.

Mirror-like finishing treatment enables a surface having, for example, a mean surface roughness $R_a$ of 0.1 μm or less and a glossiness of at least 50% to be obtained. The mean surface roughness $R_a$ is preferably 0.03 μm or less, and more preferably 0.02 μm or less. The glossiness is preferably at least 70%, and more preferably at least 80%.

The glossiness is the specular reflectance which can be determined in accordance with JIS Z8741-1997 (Method 3: 60° Specular Gloss) in a direction perpendicular to the rolling direction. Specifically, measurement is carried out using a variable-angle glossmeter (e.g., VG-1D, manufactured by Nippon Denshoku Industries Co., Ltd.) at an angle of incidence/reflection of 60° when the specular reflectance is 70% or less, and at an angle of incidence/reflection of 20° when the specular reflectance is more than 70%.

<Anodizing Treatment>

Any conventionally known method can be used for anodizing treatment. More specifically, a self-ordering method to be described below is preferably used.

The self-ordering method is a method which enhances the orderliness by using the regularly arranging nature of micropores in the anodized film and eliminating factors that may disturb an orderly arrangement. Specifically, an anodized film is formed on high-purity aluminum at a voltage appropriate for the type of electrolytic solution and at a low speed over an extended period of time (e.g., from several hours to well over ten hours).

In this method, because the pore diameter is dependent on the voltage, the desired pore diameter can be obtained to a certain degree by controlling the voltage.

The average flow rate in anodizing treatment is preferably 0.5 to 20.0 m/min, more preferably 1.0 to 15.0 m/min and even more preferably 2.0 to 10.0 m/min. Uniformity and high orderliness can be achieved by performing anodizing treatment at a flow rate within the above range.

The method of flowing the electrolytic solution under the condition described above is not subject to any particular limitation, and a method which uses a general stirring device such as a stirrer may be employed. Use of a stirrer capable of controlling the stirring speed in the digital display mode is preferable because the average flow rate can be controlled. An example of such stirring device includes a magnetic stirrer HS-50D (produced by As One Corporation).

Anodizing treatment may be carried out by, for example, a method that involves passing an electrical current through the aluminum substrate as the anode in a solution having an acid concentration of 1 to 10 wt %. Solutions that may be used in anodizing treatment are preferably acid solutions. It is preferable to use sulfuric acid, phosphoric acid, chromic acid, oxalic acid, sulfamic acid, benzenesulfonic acid and amidosulfonic acid, and more preferably sulfuric acid, phosphoric acid and oxalic acid. These acids may be used singly or in combination of two or more.

The conditions for anodizing treatment vary depending on the electrolytic solution used, and thus cannot be strictly specified. However, it is generally preferable for the electrolyte concentration to be 0.1 to 20 wt %, the temperature of the solution to be −10 to 30° C., the current density to be 0.01 to 20 A/dm$^2$, the voltage to be 3 to 300 V, and the period of electrolysis to be 0.5 to 30 hours. It is more preferable for the electrolyte concentration to be 0.5 to 15 wt %, the temperature of the solution to be −5 to 25° C., the current density to be 0.05 to 15 A/dm$^2$, the voltage to be 5 to 250 V, and the period of electrolysis to be 1 to 25 hours. It is particularly preferable for the electrolyte concentration to be 1 to 10 wt %, the temperature of the solution to be 0 to 20° C., the current density to be 0.1 to 10 A/dm$^2$, the voltage to be 10 to 200 V, and the period of electrolysis to be 2 to 20 hours.

The anodized film formed has a thickness of preferably 1 to 300 μm, more preferably 5 to 150 μm and even more preferably 10 to 100 μm.

Anodizing treatment is carried out for a period of preferably 0.5 minute to 16 hours, more preferably 1 minute to 12 hours, and even more preferably 2 minutes to 8 hours.

In addition to a method in which anodizing treatment is performed at a constant voltage, another method which involves changing the voltage continuously or intermittently may be used in anodizing treatment. In the latter case, it is preferable to gradually reduce the voltage. This method enables reduction of the resistance in the anodized film, thus achieving uniformity in the case where electrodeposition is to be performed later.

The average pore density is preferably from 50 to 1,500 pores/μm$^2$.

The area ratio occupied by the micropores is preferably from 20 to 50%. The area ratio occupied by the micropores is defined as the proportion of the sum of the areas of the individual micropore openings to the area of the aluminum surface.

At the interface between the anodized film and the aluminum substrate, the micropores have a degree of ordering as defined by formula (1):

$$\text{Degree of Ordering}(\%) = B/A \times 100 \tag{1}$$

(wherein A represents the total number of micropores in a measurement region; and B represents the number of specific micropores in the measurement region for which, when a circle is drawn so as to be centered on the center of gravity of a specific micropore and so as to be of the smallest radius that is internally tangent to the edge of another micropore, the circle includes the centers of gravity of six micropores other than the specific micropore) of preferably at least 10%, more preferably at least 15% and even more preferably at least 20%. The degree of ordering within such range enables the treatment time required for pore-ordering treatment and therefore total treatment time to be shortened.

The method of calculating the degree of ordering of the micropores is the same as that for the micropores in the microstructure to be described later except that the degree of ordering at the interface between the anodized film and the aluminum substrate is to be determined. This degree of ordering can be calculated after the bottoms of the micropores are bared by, for example, dissolving most of the anodized film in a mixed aqueous solution of phosphoric acid and chromic acid.

Step (2)

Figure 1B:
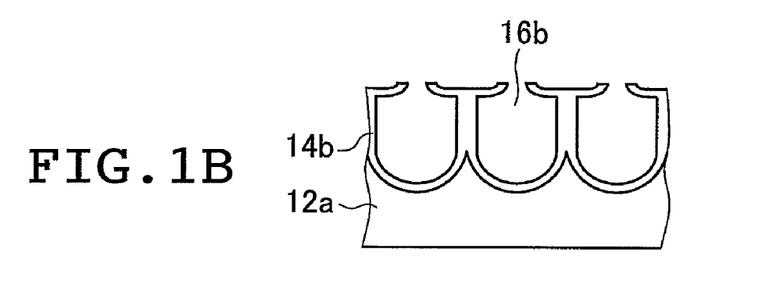

In Step (2), an acid or an alkali is used to partially dissolve the anodized film formed in Step (1). "Partially dissolve the anodized film" as used herein refers not to completely dissolving the anodized film formed in Step (1) but to partially dissolving the surface of the anodized film 14$a$ and the interiors of the micropores 16$a$ shown in FIG. 1A so that an anodized film 14$b$ having micropores 16$b$ remains on the aluminum substrate 12$a$ as shown in FIG. 1B.

The amount of material dissolved from the anodized film is preferably in a range of 0.001 to 50 wt %, more preferably 0.005 to 30 wt % and even more preferably 0.01 to 15 wt % with respect to the whole anodized film. Within the above range, disorderly array portions at the anodized film surface can be dissolved out to enhance the orderliness of the array of micropores. In addition, the anodized film remains at the micropore bottoms to enable the anodized film to keep having starting points for anodizing treatment to be performed in Step (3).

Step (2) is performed by bringing the anodized film formed on the aluminum substrate into contact with an aqueous acid solution or aqueous alkali solution. The contacting method is not particularly limited and is exemplified by immersion and spraying. Of these, immersion is preferable.

When Step (2) is to be performed with an aqueous acid solution, it is preferable to use an aqueous solution of an inorganic acid such as sulfuric acid, phosphoric acid, nitric acid or hydrochloric acid, or a mixture thereof. It is particularly preferable to use an aqueous solution containing no chromic acid in terms of its high degree of safety. It is desirable for the aqueous acid solution to have a concentration of 1 to 10 wt % and a temperature of 25 to 60° C.

When Step (2) is to be performed with an aqueous alkali solution, it is preferable to use an aqueous solution of at least one alkali selected from the group consisting of sodium hydroxide, potassium hydroxide and lithium hydroxide. It is preferable for the aqueous alkali solution to have a concentration of 0.1 to 5 wt % and a temperature of 20 to 35° C.

Specific examples of preferred solutions include a 40° C. aqueous solution containing 50 g/L of phosphoric acid, a 30° C. aqueous solution containing 0.5 g/L of sodium hydroxide, and a 30° C. aqueous solution containing 0.5 g/L of potassium hydroxide.

The aluminum substrate having the anodized film formed thereon is immersed in the aqueous acid solution or aqueous alkali solution for a period of preferably 8 to 120 minutes, more preferably 10 to 90 minutes, and even more preferably 15 to 60 minutes.

Step (3)

In Step (3), the aluminum substrate having thereon the anodized film partially dissolved in Step (2) is subjected to anodizing treatment again to grow the micropores in the depth direction.

Figure 1C:
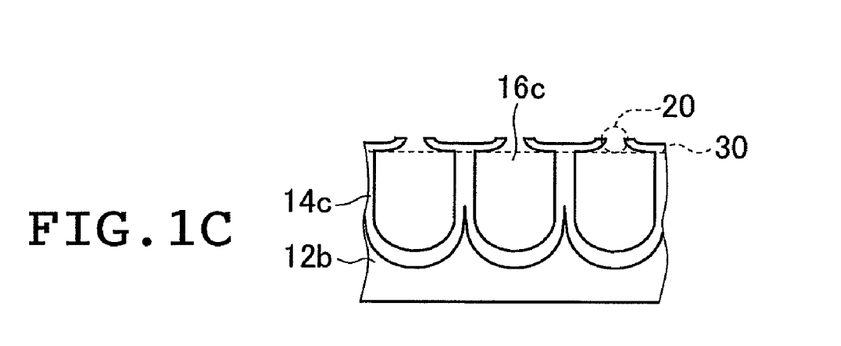

As shown in FIG. 1C, anodizing treatment in Step (3) allows the oxidation of the aluminum substrate 12$a$ shown in FIG. 1B to proceed to form an anodized film 14$c$ that has on an aluminum substrate 12$b$ micropores 16$c$ grown in the depth direction more than the micropores 16$b$.

Anodizing treatment may be performed using a method known in the art, although it is preferably performed under the same conditions as the above-described self-ordering method.

Suitable use can also be made of a method in which the current is repeatedly turned on and off in an intermittent manner while keeping the dc voltage constant, and a method in which the current is repeatedly turned on and off while intermittently changing the dc voltage. Because these methods enable formation of micropores in the anodized film, they are preferable for improving uniformity, particularly when a catalyst is supported by electrodeposition.

In the above method in which the voltage is intermittently changed, it is preferable to gradually reduce the voltage. It is possible in this way to lower the resistance in the anodized film, enabling uniformity to be achieved when electrodeposition is carried out later.

The thickness of the anodized film is preferably increased by 0.1 to 100 µm and more preferably 0.5 to 50 µm. Within the above range, the orderliness of the array of micropores can be more enhanced.

Step (4)

A part of the anodized film above inflection points 30 in cross section of the micropore 16c shown in FIG. 1C is removed in Step (4). As shown in FIG. 1C, the micropore 16c formed by the self-ordering method has an approximately direct tube shape in cross section except the upper part of the micropore 16c. In other words, the micropore 16c has in its upper part a portion which differs in cross-sectional shape from the other part of the micropore 16c. This portion 20 is hereinafter referred to as the "different shape portion 20". In Step (4), a part of the anodized film above the inflection points 30 in cross section of the micropore 16c is removed to eliminate the different shape portion 20 in the upper part of the micropore 16c. The "inflection point" 30 as used herein refers to a point where the cross-sectional shape of the micropore 16c considerably changes from the main shape (approximately straight tube shape in this case), in other words, to a point where the shape continuity from the main shape (approximately straight tube shape) is lost in the cross section of the micropore 16c.

Figure 1D:
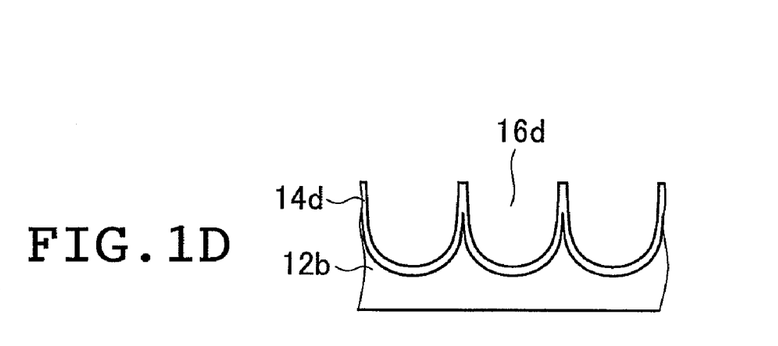

Removal of a part of the anodized film above the inflection points 30 in cross section of the micropore 16c provides a micropore 16d having an approximately straight tube shape as a whole as shown in FIG. 1D.

The cross section of the anodized film 14c after the end of Step (3) may be imaged by the field emission scanning electron microscope (FE-SEM) to specify the inflection points 30 in cross section of the micropore 16c so that a part of the anodized film above the inflection points 30 can be removed.

The micropore has the different shape portion mainly in the case where the anodized film 14a was newly formed on the aluminum substrate 12a as in Step (1). Therefore, the anodized film formed in Step (1) is removed in Step 4 in order to remove a part of the anodized film above the inflection points 30 in cross section of the micropore 16c to eliminate the different shape portion 20 in the upper part of the micropore 16c.

In the case where Steps (3) and (4) are repeatedly performed twice or more as will be described later, an anodized film 14d after the end of Step (4) from which the different shape portion 20 has been removed has the micropore 16d which is in an approximately straight tube shape as a whole, so that a micropore formed in Step (3) following Step (4) (Step (3')) has a new different shape portion in its upper part. Therefore, in Step (4) following Step (3') (Step (4')), it is necessary to remove the different shape portion newly formed in the upper part of the micropore in Step (3'), which requires removal of a part of the anodized film above the inflection points in cross section of the micropore formed in Step (3').

For example, polishing treatments such as mechanical polishing, chemical polishing and electrolytic polishing may be used to remove a part of the anodized film above the inflection points in cross section of the micropores 16c. However, it is preferable to use a treatment in which the anodized film is dissolved using an acid or an alkali as in Step (2). In this case, the anodized film 14d which is thinner than the anodized film 14c shown in FIG. 1C is formed as shown in FIG. 1D.

In FIG. 1D, the anodized film 14d still remains on the aluminum substrate 12b. However, the whole anodized film on the aluminum substrate 12b may be dissolved and removed in Step (4). In the case where the whole anodized film is dissolved and removed in Step (4), a microstructure is obtained in this Step (4). More specifically, in the case where Steps (3) and (4) are repeatedly performed twice or more, it is necessary to dissolve and remove the whole anodized film not in Step (4) to be followed by Step (3) but in the last Step (4).

In the case where the whole anodized film has been dissolved and removed, pits which are present at the surface of the aluminum substrate serve as micropores of the resulting microstructure.

In the case where an acid or an alkali is used to partially dissolve the anodized film in Step (4), the amount of material dissolved from the anodized film is not particularly limited and is preferably in a range of 0.01 to 30 wt % and more preferably 0.1 to 15 wt % with respect to the whole anodized film. Within the above range, disorderly array portions at the anodized film surface can be dissolved out to enhance the orderliness of the array of micropores. In the case where Steps (3) and (4) are repeatedly performed twice or more, the anodized film can keep having starting points for one or more anodizing treatments to be performed in the second and any subsequent cycles.

In terms of enhancing the orderliness of the array of micropores, Steps (3) and (4) are repeatedly performed preferably twice or more, more preferably three times or more, and even more preferably four times or more.

In the case where these steps are repeatedly performed twice or more, the conditions in Steps (3) and (4) of the respective cycles may be the same or different. In terms of improving the degree of ordering, Step (3) is preferably performed by changing the voltage in each cycle. In this case, it is more preferable to gradually shift to higher voltage conditions in terms of improving the degree of ordering.

<Microstructure>

The manufacturing method of the invention yields the microstructure of the invention.

The average pore density of the microstructure of the invention is preferably from 50 to 1,500 pores/$\mu m^2$.

The area ratio occupied by the micropores in the microstructure of the invention is preferably from 20 to 50%.

In addition, the microstructure of the invention has preferably the micropores with a degree of ordering as defined by formula (1):

$$\text{Degree of Ordering}(\%) = B/A \times 100 \qquad (1)$$

(wherein A represents the total number of micropores in a measurement region; and B represents the number of specific micropores in the measurement region for which, when a circle is drawn so as to be centered on the center of gravity of a specific micropore and so as to be of the smallest radius that is internally tangent to the edge of another micropore, the circle includes the centers of gravity of six micropores other than the specific micropore) of at least 50%.

Figure 2A:
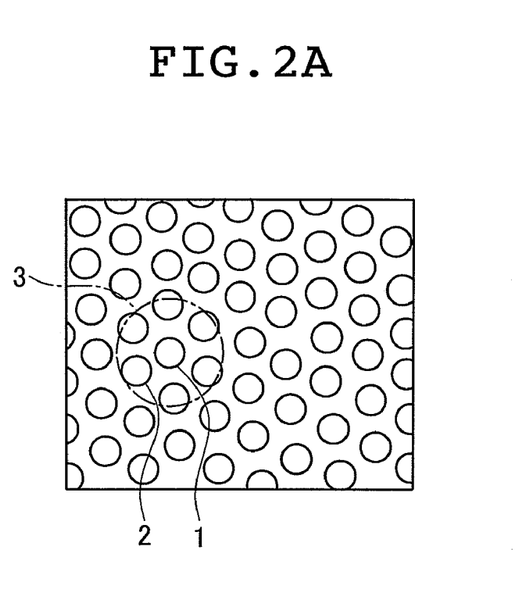
FIGS. 2A and 2B are views illustrating a method for calculating the degree of ordering of pores.
Figure 2B:
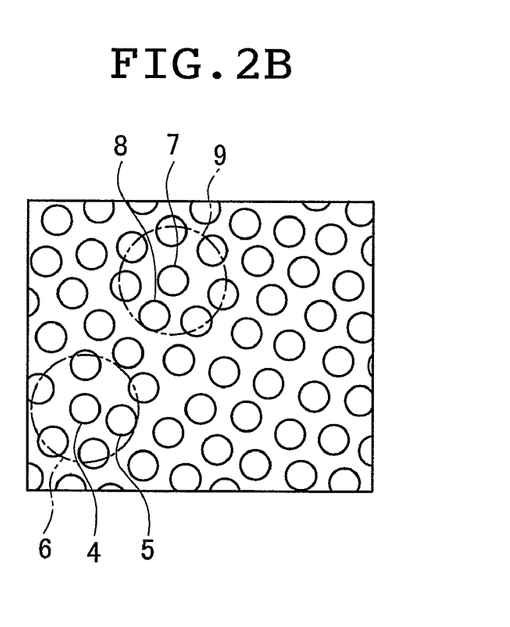

FIGS. 2A and 2B are views illustrating a method for calculating the degree of ordering of pores. Formula (1) is explained more fully below in conjunction with FIGS. 2A and 2B.

With regard to a micropore 1 shown in FIG. 2A, when a circle 3 is drawn so as to be centered on the center of gravity of the micropore 1 and so as to be of the smallest radius that is internally tangent to the edge of another micropore (inscribed in a micropore 2), the interior of the circle 3 includes the centers of gravity of six micropores other than the micropore 1. Therefore, the micropore 1 is counted for B.

With regard to a micropore 4 shown in FIG. 2B, when a circle 6 is drawn so as to be centered on the center of gravity of the micropore 4 and so as to be of the smallest radius that is internally tangent to the edge of another micropore (inscribed in a micropore 5), the interior of the circle 6 includes the centers of gravity of five micropores other than the micropore 4. Therefore, the micropore 4 is not counted for B. With regard to a micropore 7 shown in FIG. 2B, when a circle 9 is drawn so as to be centered on the center of gravity of the micropore 7 and so as to be of the smallest radius that is internally tangent to the edge of another micropore (inscribed in a micropore 8), the interior of the circle 9 includes the centers of gravity of seven micropores other than the micropore 7. Therefore, the micropore 7 is not counted for B.

<Other Treatment>

Other treatments may be performed as needed.

For example, when the microstructure of the invention is to be used as a sample holder on which an aqueous solution will be deposited to form a film, hydrophilizing treatment may be performed to reduce the contact angle with water. Such hydrophilizing treatment may be performed by a method known in the art.

Alternatively, when the inventive microstructure is to be used as a sample holder for protein that will be denatured or decomposed with acid, neutralizing treatment may be performed to neutralize acids that are used in pore widening treatment and remain as residues on the aluminum surface. Such neutralizing treatment may be performed by a method known in the art.

In the microstructure of the invention, the aluminum substrate may be removed depending on the intended application.

The method of removing the aluminum substrate is not subject to any particular limitation, and it is preferable to use, for example, a method in which the aluminum substrate is immersed in a solvent in which alumina is hardly soluble or insoluble but aluminum is soluble.

Preferred solvents that may be used include halogen solvents (e.g., bromine and iodine); acidic solvents such as dilute sulfuric acid, phosphoric acid, oxalic acid, sulfamic acid, benzenesulfonic acid and amidosulfonic acid; and alkaline solvents such as sodium hydroxide, potassium hydroxide and calcium hydroxide. Bromine and iodine are particularly preferable.

The microstructure of the invention may support a catalyst in the micropores of the anodized film according to the intended application.

The catalyst is not subject to any particular limitation as long as the catalyst used has a catalytic function, and examples of the catalyst that may be used include $AlCl_3$, $AlBr_3$, $Al_2O_3$, $SiO_2$, $SiO_2$—$Al_2O_3$, silicon zeolite, $SiO_2$—$NiO$, active carbon, $PbO/Al_2O_3$, $LaCoO_3$, $H_3PO_4$, $H_4P_2O_7$, $Bi_2O_3$—$MoO_3$, $Sb_2O_5$, $SbO_5$—$Fe_2O_3$, $SnO_2$—$Sb_2O_5$, Cu, $CuO_2$—$Cr_2O_3$, Cu—$Cr_2O_3$—ZnO, $Cu/SiO_2$, $CuCl_2$, Ag/α-$Al_2O_3$, Au, ZnO, ZnO—$Cr_2O_3$, $ZnCl_2$, ZnO—$Al_2O_3$—CaO, $TiO_2$, $TiCl_4$·$Al(C_2H_5)_3$, $Pt/TiO_2$, $V_2O_5$, $V_2O_5$—$P_2O_5$, $V_2O_5/TiO_2$, $Cr_2O_3$, $Cr_2O_3/Al_2O_3$, $MoO_3$, $MoO_3$—$SnO_2$, Co.Mo/$Al_2O_3$, $Ni.Mo/Al_2O_3$, $MoS_2$, Mo—Bi—O, $MoO_3$—$Fe_2O_3$, $H_3PMo_{12}O_{40}$, $WO_3$, $H_3PW_{12}O_{40}$, $MnO_2$, Fe—$K_2O$—$Al_2O_3$, $Fe_2O_3$—$Cr_2O_3$, $Fe_2O_3$—$Cr_2O_3$—$K_2O$, $Fe_2O_3$, Co, cobalt/active carbon, $CO_3O_4$, cobalt carbonyl complex, Ni, Raney nickel, nickel/support, modified nickel, Pt, $Pt/Al_2O_3$, Pt—Rh—Pd/support, Pd, $Pd/SiO_2$, $Pd/Al_2O_3$, $PdCl_2$—$CuCl_2$, Re, Re—$Pt/Al_2O_3$, $Re_2O_7/Al_2O_3$, Ru, $Ru/Al_2O_3$, Rh, and rhodium complex.

The method of supporting the catalyst is not particularly limited but any conventionally known technique may be used.

Examples of preferred techniques include electrodeposition, and a method which involves coating the aluminum member having the anodized film with a dispersion of catalyst particles, then drying. The catalyst is preferably in the form of single particles or agglomerates.

An electrodeposition method known in the art may be used. For example, in the case of gold electrodeposition, use may be made of a process in which the aluminum member is immersed in a 30° C. dispersion containing 1 g/L of $HAuCl_4$ and 7 g/L of $H_2SO_4$ and electrodeposition is carried out at a constant voltage of 11 V (regulated with an autotransformer such as SLIDAC) for 5 to 6 minutes.

An example of the electrodeposition method which employs copper, tin and nickel is described in detail in Gendai Kagaku (Contemporary Chemistry), pp. 51-54 (January 1997)). Use can be made of this method as well.

The dispersions employed in methods which use catalyst particles can be obtained by a conventionally known method. Illustrative examples include methods of preparing fine particles by low-vacuum vapor deposition and methods of preparing catalyst colloids by reducing an aqueous solution of a catalyst salt.

The colloidal catalyst particles have an average particle size of preferably 1 to 200 nm, more preferably 1 to 100 nm, and even more preferably 2 to 80 nm.

Preferred use can be made of water as the dispersion medium employed in the dispersion. Use can also be made of a mixed solvent composed of water and a solvent that is miscible with water, such as an alcohol, illustrative examples of which include ethyl alcohol, n-propyl alcohol, i-propyl alcohol, 1-butyl alcohol, 2-butyl alcohol, t-butyl alcohol, methyl cellosolve and butyl cellosolve.

No particular limitation is imposed on the technique used for coating the aluminum member with the dispersion of colloidal catalyst particles. Suitable examples of such techniques include bar coating, spin coating, spray coating, curtain coating, dip coating, air knife coating, blade coating and roll coating.

Preferred examples of dispersions that may be employed in methods which use colloidal catalyst particles include dispersions of colloidal gold particles and dispersions of colloidal silver particles.

Dispersions of colloidal gold particles that may be used include those described in JP 2001-89140 A and JP 11-80647 A. Commercial products may also be used.

Dispersions of colloidal silver particles preferably contain particles of silver-palladium alloys because they are not affected by the acids which leach out of the anodized film. The palladium content in such a case is preferably from 5 to 30 wt %.

Application of the dispersion is followed by cleaning, which may be appropriately performed using a solvent such as water. As a result of such cleaning, only the catalyst particles supported in the micropores remain in the anodized film whereas catalyst particles that have not been supported in the micropores are removed.

The amount of supported catalyst is preferably 10 to 1,000 mg/m$^2$, more preferably 50 to 800 mg/m$^2$ and even more preferably 100 to 500 mg/m$^2$.

The surface porosity after catalyst supporting treatment is preferably not more than 70%, more preferably not more than 50% and even more preferably not more than 30%. The surface porosity after catalyst supporting treatment is defined as the sum of the areas of the openings in micropores having no catalyst supported therein relative to the area of the aluminum surface.

Colloidal catalyst particles which may be used in the dispersion generally have a dispersion in the particle size distribution, expressed as the coefficient of variation, of about 10 to 20%. In the practice of the invention, by setting the dispersion in pore size within a specific range, colloidal particles with dispersed particle size distribution can be efficiently supported.

When the pore size is 50 nm or more, suitable use may be made of a method which employs colloidal catalyst particles. When the pore size is less than 50 nm, suitable use may be made of an electrodeposition process. Suitable use may also be made of a method which combines both approaches.

The microstructure of the invention has regularly arranged micropores, and can therefore be employed in various applications.

EXAMPLES

Examples are given below by way of illustration and should not be construed as limiting the invention.

1. Fabrication of Microstructure

Examples 1 to 6 and Comparative Example 1

After having been subjected to mirror-like finishing treatment, substrate samples were subjected to the treatments as shown in Tables 1 to obtain microstructures in Examples 1 to 6 and Comparative Example 1. In Table 1, a dash (-) indicates that the treatment in question was not carried out.

TABLE 1

|  |  | EX 1 | EX 2 | EX 3 | EX 4 | EX 5 | EX 6 | CE 1 | CE 2 |
|---|---|---|---|---|---|---|---|---|---|
| Metal substrate | | Aluminum | Aluminum | Aluminum | Aluminum | Aluminum | Aluminum | Aluminum | Aluminum |
| Step (1) | Electrolyte | 0.3 M $H_2SO_4$ | 0.3 M $H_2SO_4$ | 0.3 M $H_2SO_4$ | 0.5 M $C_2H_2O_4$ | 2:8 blend of 0.3 M $H_2SO_4$ and 0.5 M $C_2H_2O_4$ | 9:1 blend of 0.5 M $C_2H_2O_4$ and 0.3 M $H_3PO_4$ | 0.3 M $H_2SO_4$ | 0.3 M $H_2SO_4$ |
| | Voltage (V) | 25 | 25 | 20 | 40 | 35 | 55 | 25 | 25 |
| | Temperature (° C.) | 15 | 15 | 14 | 16 | 15 | 10 | 8 | 15 |
| | Electrolyte flow rate (cm/s) | 3 | 3 | 4 | 5 | 3 | 5 | 3 | 3 |
| | Treatment time (min) | 60 | 60 | 80 | 60 | 60 | 60 | 60 | 420 |
| Step (2) | Treatment solution | 0.5 M $H_3PO_4$ | 0.5 M $H_3PO_4$ | 0.3 M $H_3PO_4$ | 0.5 M $H_2SO_4$ | 0.5 M $H_3PO_4$ | 0.8 M KOH | 0.5 M $H_3PO_4$ | $CrO_3/H_3PO_4$ |
| | Temperature (° C.) | 40 | 40 | 30 | 20 | 40 | 40 | 40 | 50 |
| | Treatment solution flow rate (cm/s) | 3 | 3 | 6 | 3 | 3 | 3 | 3 | 0 |
| | Treatment time (min) | 15 | 15 | 30 | 20 | 20 | 10 | 5 | 720 |
| Step (3) | Electrolyte | 0.3 M $H_2SO_4$ | 0.3 M $H_2SO_4$ | 0.3 M $H_2SO_4$ | 0.5 M $C_2H_2O_4$ | 2:8 blend of 0.3 M $H_2SO_4$ and 0.5 M $C_2H_2O_4$ | 9:1 blend of 0.5 M $C_2H_2O_4$ and 0.3 M $H_3PO_4$ | 0.3 M $H_2SO_4$ | 0.3 M $H_2SO_4$ |
| | Voltage (V) | 25 | 25 | 20 | 40 | 35 | 55 | 25 | 25 |
| | Temperature (° C.) | 15 | 15 | 14 | 16 | 15 | 10 | 8 | 15 |
| | Electrolyte flow rate (cm/s) | 3 | 3 | 4 | 5 | 3 | 5 | 3 | 3 |
| | Treatment time (min) | 60 | 60 | 60 | 60 | 60 | 60 | 60 | 60 |
| Step (4) | Treatment solution | 0.5 M $H_3PO_4$ | 0.5 M $H_3PO_4$ | 0.6 M NaOH | 0.5 M $H_2SO_4$ | 0.5 M $H_3PO_4$ | 0.8 M KOH | 0.5 M $H_3PO_4$ | — |
| | Temperature (° C.) | 40 | 40 | 30 | 20 | 40 | 40 | 40 | — |
| | Treatment solution flow rate (cm/s) | 15 | 15 | 20 | 20 | 20 | 20 | 6 | — |
| | Treatment time (min) | 15 | 15 | 5 | 15 | 25 | 10 | 5 | — |
| | Removal of anodized film | Good | Good | Good | Good | Good | Good | Poor | — |
| Number of cycles of Steps (3) and (4) | | 3 | 5 | 7 | 7 | 5 | 5 | 5 | — |
| Degree of ordering (%) | | 90 | 92 | 95 | 95 | 93 | 92 | 70 | 75 |
| Total treatment time (min) | | 300 | 450 | 705 | 605 | 505 | 420 | 390 | 1200 |

The substrate and the respective treatments are described below.

[1] Metal Substrate

The metal substrate used to manufacture the microstructures was a high purity aluminum substrate (produced by Sumitomo Light Metal Industries, Ltd; purity, 99.99 wt %; thickness, 0.4 mm). This substrate was cut and used so as to enable anodizing treatment to be carried out over an area of 10 cm square.

[2] Mirror-Like Finishing Treatment

The substrate was subjected to the following mirror-like finishing treatment.

<Mirror-Like Finishing Treatment>

In mirror-like finishing treatment, polishing with an abrasive cloth, buffing, then electrolytic polishing were carried out in this order. After buffing, the substrate was rinsed with water. Polishing with an abrasive cloth was carried out using a polishing platen (Abramin, produced by Marumoto Struers K.K.) and commercial water-resistant abrasive cloths. This polishing operation was carried out while successively changing the grit size of the water-resistant abrasive cloths in the following order: #200, #500, #800, #1000 and #1500. Buffing was carried out using slurry-type abrasives (FM No. 3 (average particle size, 1 μm) and FM No. 4 (average particle size, 0.3 μm), both made by Fujimi Incorporated). Electrolytic polishing was carried out for 2 minutes in an electrolytic solution of the composition indicated below (temperature, 70° C.), using the substrate as the anode and a carbon electrode as the cathode, and at a constant current of 130 mA/cm$^2$. The power supply was a GP0110-30R unit manufactured by Takasago, Ltd.

| <Electrolytic Solution Composition> | |
|---|---|
| 85 wt % Phosphoric acid (Wako Pure Chemical Industries, Ltd.) | 660 mL |
| Pure water | 160 mL |
| Sulfuric acid | 150 mL |
| Ethylene glycol | 30 mL |

[3] Step (1)—Anodized Film-Forming Step

Anodizing treatment was performed under the conditions shown in Table 1 on the surface of each substrate which had been mirror-like finished. More specifically, the substrate was immersed in the electrolytic solution of the type and concentration shown in Table 1 to perform anodization through direct current electrolysis under such conditions as the voltage, temperature, average flow rate and treatment time shown in Table 1, thereby forming an anodized film. In anodizing treatment, use was made of NeoCool BD36 (Yamato Scientific Co., Ltd.) as the cooling system, Pairstirrer PS-100 (Tokyo Rikakikai Co., Ltd.) as the stirring and warming unit, and a GP0650-2R unit (Takasago, Ltd.) as the power supply. The average flow rate of the electrolytic solution was measured using the vortex flow monitor FLM22-10PCW (manufactured by As One Corporation).

[4] Step (2)—Step of Partially Dissolving the Anodized Film

Then, a treatment for partially dissolving the anodized film was performed under the conditions shown in Table 1. More specifically, the aluminum substrate having the anodized film formed thereon was immersed in a treatment solution of the type and concentration shown in Table 1 under such conditions as the temperature, flow rate and immersion time shown in Table 1, thereby partially dissolving the anodized film.

[5] Step (3)—Anodizing Step

Then, the substrate was immersed in the electrolytic solution of the type and concentration shown in Table 1 to perform anodization through direct current electrolysis under such conditions as the voltage, temperature, average flow rate and treatment time shown in Table 1, thereby growing the anodized film in the depth direction. Those of the same types as the various apparatuses described for Step (1) were used.

[6] Step (4)—Step of Removing a Part of the Anodized Film Above the Inflection Points in Micropore Cross Section The anodized film was subjected to film dissolution treatment in order to remove a part of the anodized film above the inflection points in cross section of the micropores after the end of Step (3) so that the micropores may each have an approximately straight tube shape in cross section. More specifically, the aluminum substrate having the anodized film formed thereon was treated under such conditions as the type and concentration of the treatment solution, temperature, flow rate and immersion time shown in Table 1. The cross section of the anodized film before and after the immersion was imaged by FE-SEM to confirm the micropore shape after the treatment. The results are shown in Table 1. In Table 1, a micropore with a cross-sectional shape of a straight tube was rated good, whereas a micropore with a cross-section shape of a non-straight tube was rated poor.

[7]—Repeatedly Performed Steps (3) and (4)

[5] Step (3) and [6] Step (4) as mentioned above were repeatedly performed up to the number of times shown in Table 1 to obtain each microstructure.

Comparative Example 2

The aluminum substrate polished in the same manner as in Examples 1 to 6 and Comparative Example 1 was anodized for 7 hours by using an aqueous solution containing 0.30 mol/L sulfuric acid as the electrolytic solution under such conditions as a voltage of 25V, a solution temperature of 15° C. and a solution flow rate of 3.0 cm/s. A stainless steel electrode was used for the cathode, and the GP0110-30R unit (Takasago, Ltd.) for the power supply. Use was made of NeoCool BD36 (Yamato Scientific Co., Ltd.) as the cooling system, and Pairstirrer PS-100 (Tokyo Rikakikai Co., Ltd.) as the stirring and warming unit. The flow rate of the electrolytic solution was measured using the vortex flow monitor FLM22-10PCW (manufactured by As One Corporation).

The sample obtained after anodizing treatment was immersed in a mixed aqueous solution of 0.18 mol/L chromic anhydride (chromic (VI) acid compound) and 0.62 mol/L phosphoric acid having a temperature of 50° C. for 12 hours.

The sample obtained after film dissolution treatment was anodized for 1 hour by using an aqueous solution containing 0.30 mol/L sulfuric acid as the electrolytic solution under such conditions as a voltage of 25V, a solution temperature of 15° C. and a solution flow rate of 3.0 cm/s. A stainless steel electrode was used for the cathode, and the power supply, cooling system, and stirring and warming unit used were of the same types as described in [3] Step (1). The flow rate of the electrolytic solution was measured using the vortex flow monitor FLM22-10PCW (manufactured by As One Corporation).

2. Shape Analysis of Microstructure

Surface images of the resulting microstructures were taken by FE-SEM at a magnification of 20,000× and the degree of ordering of the micropores as defined by formula (1) was measured with a field of view of 2 μm×2 μm. The degree of ordering was measured at ten points and the average of the measurements was calculated.

3. Total Treatment Time for Manufacture

The total treatment time required for obtaining the microstructure was measured and is shown in Table 1.

What is claimed is:

1. A method of manufacturing a microstructure, wherein an aluminum substrate is subjected to, in order,
   (1) a step of subjecting a surface of the aluminum substrate to a first anodizing treatment to form an anodized film having micropores on the surface of the aluminum substrate;

(2) a step of partially dissolving the anodized film using an acid or alkali;

(3) a step of performing a second anodizing treatment to grow the micropores in their depth direction; and (4) a step of removing a part of the anodized film above inflection points in cross section of the micropores, whereby the microstructure having the micropores with a cross-section shape of an approximately direct tube shape formed at a surface of the anodized film is obtained.

2. The manufacturing method according to claim 1, wherein the steps (3) and (4) are repeatedly performed twice or more in this order.

3. The manufacturing method according to claim 2, wherein, in the step (4), the anodized film is dissolved and removed using an acid or alkali.

4. The manufacturing method according to claim 1, wherein, in the step (4), the anodized film is dissolved and removed using an acid or alkali.

5. The manufacturing method according to claim 1, wherein the inflection points in the cross-section of the micropores are portions of the micropore having a substantially different cross-sectional shape than a main cross-sectional shape of the micropore.

* * * * *